(12) United States Patent
Hou

(10) Patent No.: US 8,274,315 B2
(45) Date of Patent: Sep. 25, 2012

(54) VOLTAGE SEQUENCE OUTPUT CIRCUIT

(75) Inventor: Chuan-Tsai Hou, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 154 days.

(21) Appl. No.: 12/972,498

(22) Filed: Dec. 19, 2010

(65) Prior Publication Data

US 2012/0139614 A1 Jun. 7, 2012

(30) Foreign Application Priority Data

Dec. 7, 2010 (TW) .............................. 99142688 A

(51) Int. Cl.
*H03L 7/00* (2006.01)
(52) U.S. Cl. .................... 327/141; 327/142; 327/519
(58) Field of Classification Search .......... 327/141–142, 327/519

See application file for complete search history.

(56) References Cited

U.S. PATENT DOCUMENTS 7,876,128 B1 * 1/2011 Hou ............................... 326/57

* cited by examiner

*Primary Examiner* — Kenneth B. Wells
(74) *Attorney, Agent, or Firm* — Altis Law Group, Inc.

(57) ABSTRACT

A voltage sequence output circuit includes input terminals of a NOR gate connected to first and second input terminals. An output terminal of the NOR gate connected to a first terminal of a first electrical switch. A third terminal of the first electrical switch connected to a power source. A first terminal of a second electrical switch connected to the first input terminal and the power source through a first resistor. A second terminal of the second electrical switch connected to a second terminal of the first electrical switch. A third terminal of the second electrical switch connected to a first output terminal and a second terminal of a third electrical switch. A first terminal of the third electrical switch connected to a second input terminal and the power source through a second resistor. A third terminal of the third electrical switch connected to a second output terminal.

8 Claims, 2 Drawing Sheets

VOLTAGE SEQUENCE OUTPUT CIRCUIT

BACKGROUND

1. Technical Field

The present disclosure relates to voltage output circuits and, particularly, to a voltage sequence output circuit capable of sequentially triggering electronic devices.

2. Description of Related Art

As the number of loads that are coupled to one circuit are powered simultaneously, the circuit may be prone to voltage surges when powering on the circuit. Accordingly, there are various voltage sequence output circuits designed for sequentially triggering the loads to limit the surge voltage of the loads and to improve the reliability of the circuits. However, traditional voltage sequence output circuits typically include very expensive integrated circuit chips such as a control chip, thereby the cost of these circuits increases.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of examples and not by limitation. It should be noted that references to "an" or "one" embodiment in this disclosure are not necessarily to the same embodiment, and such references mean at least one.

Figure 1:
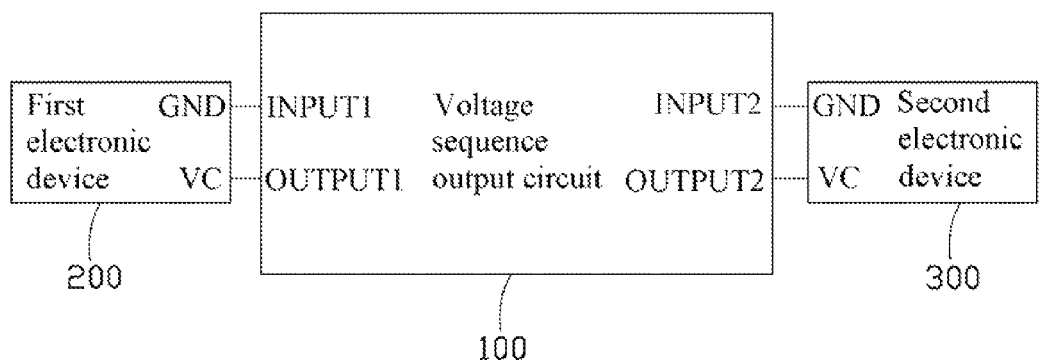
FIG. 1 is a schematic diagram of an exemplary embodiment of a voltage sequence output circuit, the voltage sequence output circuit is connected between a first electronic device and a second electronic device.
Figure 2:
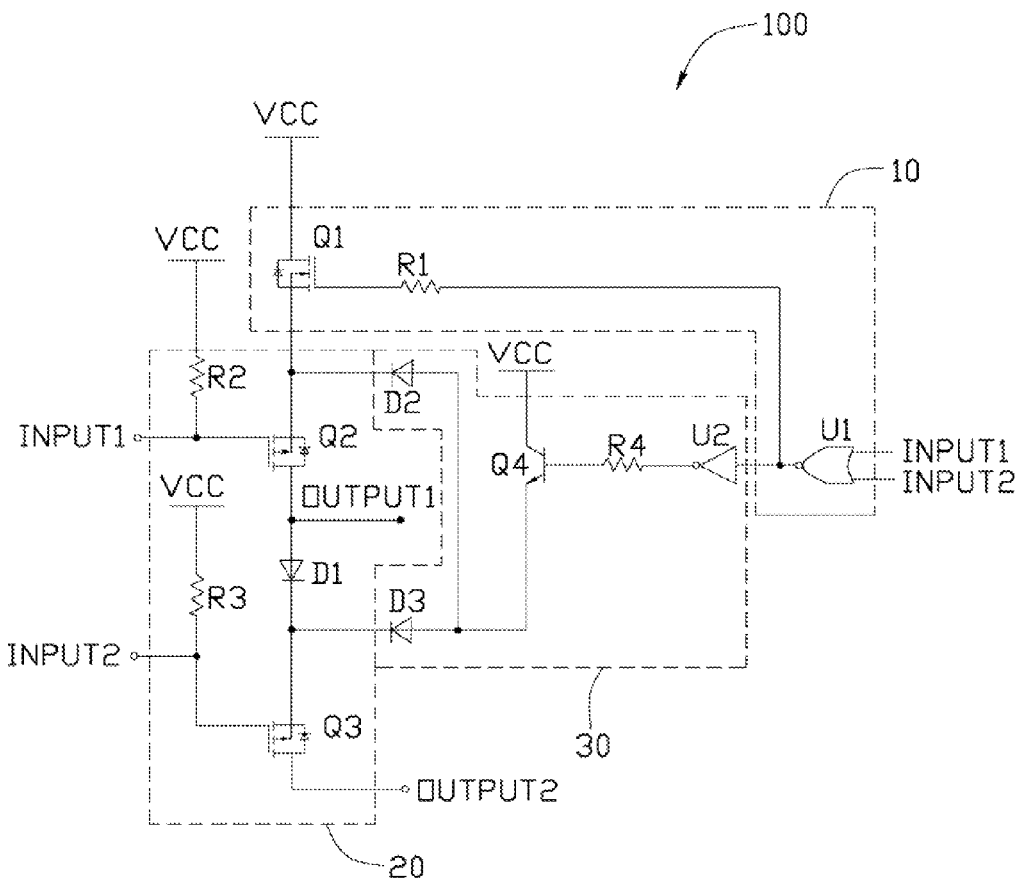
FIG. 2 is a circuit diagram of the voltage sequence output circuit of FIG. 1.

Referring to FIG. 1 and FIG. 2, a voltage sequence output circuit 100 is configured for sequentially triggering electronic devices, such as a first electronic device 200 and a second electronic device 300. Each of the first electronic device 200 and the second electronic device 300 includes a ground terminal GND and a power terminal VC. The voltage sequence output circuit 100 in accordance with an exemplary embodiment includes input terminals INPUT1 and INPUT2, output terminals OUTPUT1 and OUTPUT2, a first control circuit 10, a voltage output circuit 20, and a second control circuit 30. When the first electronic device 200 and the second electronic device 300 are connected to the voltage sequence output circuit 100, namely, the input terminal INPUT1 and the output terminal OUTPUT1 of the voltage sequence output circuit 100 are respectively connected to the ground terminal GND and the power terminal VC of the first electronic device 200. The input terminal INPUT2 and the output terminal OUTPUT2 of the voltage sequence output circuit 100 are respectively connected to the ground terminal GND and the power terminal VC of the second electronic device 300.

The first control circuit 10 includes a NOR gate U1, a resistor R1, and an electrical switch, such as an n-channel field effect transistor (FET) Q1. Two input terminals of the NOR gate U1 are respectively connected to the input terminals INPUT1 and INPUT2. An output terminal of the NOR gate U1 is connected to the second control circuit 30 and also connected to a gate of the FET Q1 through the resistor R1. A source of the FET Q1 is connected to the voltage output circuit 20. A drain of the FET Q1 is connected to a power source VCC.

The voltage output circuit 20 includes two electrical switches, such as two p-channel FETs Q2 and Q3, two resistors R2 and R3, and a diode D1. A gate of the FET Q2 is connected to the first input terminal INPUT1 is also connected to the power source VCC through the resistor R2. A source of the FET Q2 is connected to the source of the FET Q1 is also connected to the second control circuit 30. A drain of the FET Q2 is connected to the first output terminal OUTPUT1 is also connected to an anode of the diode D1. A gate of the FET Q3 is connected to the second input terminal INPUT2 and is also connected to the power source VCC through the resistor R3. A source of the FET Q3 is connected to the second control circuit 30 is also connected to a cathode of the diode D1. A drain of the FET Q3 is connected to the second output terminal OUTPUT2. In other embodiments, the number of the FETs, the input terminals, and the output terminals of the voltage output circuit 20 can be changed according to different voltage output requirements.

The second control circuit 30 includes a NOT gate U2, a resistor R4, an electrical switch, such as an npn transistor Q4, and two diodes D2 and D3. An input terminal of the NOT gate U2 is connected to the output terminal of the NOR gate U1. An output terminal of the NOT gate U2 is connected to a base of the transistor Q4 through the resistor R4. A collector of the transistor Q4 is connected to the power source VCC. An emitter of the transistor Q4 is connected to anodes of the diodes D2 and D3. A cathode of the diode D2 is connected to the source of the FET Q2. A cathode of the diode D3 is connected to the source of the FET Q3.

In use, when the first electronic device 200 and the second electronic device 300 are connected to the voltage sequence output circuit 100, namely, the input terminal INPUT1 and the output terminal OUTPUT1 are respectively connected to the ground terminal GND and the power terminal VC of the first electrical device 200, and the second input terminal INPUT2 and the second output terminal OUTPUT2 are respectively connected to the ground terminal GND and the power terminal VC of the second electronic device 300. The NOR gate U1 receives two low level signals from the first input terminal INPUT1 and the second input terminal INPUT2, and outputs a high level signal. The NOT gate U2 converts the high level signal to a low level signal and provides the low level signal to the transistor Q4, the transistor Q4 is turned off. The FET Q1 receives a high level signal from the output terminal of the NOR gate U1 and is turned on. The gate of the FET Q2 receives a low level signal from the first input terminal INPUT1 and is turned on. The source of the FET Q2 is at a high level signal, and the diode D2 is turned off. The drain of the FET Q2 is at a high level signal, and the first output terminal OUTPUT1 outputs a high level signal to the power terminal VC of the first electrical device 200, to make the first electrical device 200 work. The diode D1 receives the high level signal from the drain of the FET Q2 and is turned on. At the same time, the diode D3 is turned off. The gate of the FET Q3 receives a low level signal from the second input terminal INPUT2 and is turned on. The drain of the FET Q3 is at a high level signal, and the second output terminal OUTPUT2 outputs a high level signal to the power terminal VC of the second electronic device 300, to make the second electrical device 300 work. Therefore, the voltage sequence output circuit 100 can sequentially trigger the first electronic device 200 and the second electronic device 300.

When only the first electronic device 200 is connected to the voltage sequence output circuit 100, the first input terminal INPUT1 and the first output terminal OUTPUT1 are respectively connected to the ground terminal GND and the power terminal VC of the first electronic device 200. The first input terminal INPUT1 receives a low level signal, and the FET Q2 is turned on. The second input terminal INPUT2 receives a high level signal from the power source VCC, and the FET Q3 is turned off. The NOR gate U1 receives a low level signal from the first input terminal INPUT1 and a high level signal from the second input terminal INPUT2, and outputs a low level signal. The FET Q1 receives the low level signal from the output terminal of the NOR gate U1 and is turned off. The NOT gate U2 converts the low level signal to a high level signal and provides the high level signal to the transistor Q4. The transistor Q4 is turned on, at the same time, the diodes D2 and D3 are turned on. The first output terminal OUTPUT1 outputs a high level signal to the power terminal VC of the first electronic device 200, to make the first electrical device 200 work.

When only the second electronic device 300 is connected to the voltage sequence output circuit 100, the second input terminals INPUT2 and the second output terminal OUTPUT2 are respectively connected to the ground terminal GND and the power terminal VC of the second electronic device 300. The second input terminal INPUT2 receives a low level signal, and the FET Q3 is turned on. The first input terminal INPUT1 receives a high level signal from the power source VCC, and the FET Q2 is turned off. The NOR gate U1 receives a high level signal from the first input terminal INPUT1 and a low level signal from the second input terminal INPUT2, and outputs a low level signal. The FET Q1 receives the low level signal from the output terminal of the NOR gate U1 and is turned off. The NOT gate U2 converts the low level signal to a high level signal and provides the high level signal to the transistor Q4. The transistor Q4 receives the high level signal and is turned on, at the same time, the diodes D2 and D3 are turned on. The second output terminal OUTPUT2 outputs a high level signal to the power terminal VC of the second electronic device 300, to make the second electrical device 300 work.

The voltage sequence output circuit 100 can sequentially trigger the first electronic device 200 and the second electronic device 300, to limit the initial voltage of the loads and improve the reliability of the circuits. The voltage sequence output circuit 100 is simple and saves costs.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A voltage sequence output circuit sequentially triggering electronic devices, each electronic device comprising a ground terminal and a power terminal, the voltage sequence output circuit comprising:
   first and second input terminals respectively connected to the ground terminals of the electronic devices;
   first and second output terminals respectively connected to the power terminals of the electronic devices;
   a first control circuit comprising a NOR gate and a first electrical switch with first to third terminals, wherein input terminals of the NOR gate are connected to the first and the second input terminals, an output terminal of the NOR gate is connected to the first terminal of the first electrical switch, and the third terminal of the first electrical switch is connected to a power source; and
   a voltage output circuit comprising a second electrical switch, a third electrical switch, a first resistor, and a second resistor, wherein a first terminal of the second electrical switch is connected to the first input terminal and also connected to the power source through the first resistor, a second terminal of the second electrical switch is connected to the second terminal of the first electrical switch, a third terminal of the second electrical switch is connected to the first output terminal and also connected to a second terminal of the third electrical switch, a first terminal of the third electrical switch is connected to the second input terminal and also connected to the power source through the second resistor, and a third terminal of the third electrical switch is connected to the second output terminal.

2. The voltage sequence output circuit of claim 1, wherein the first electrical switch is an n-channel field effect transistor, the first to the third terminals of the first electrical switch corresponding to a gate, a source, and a drain of the field effect transistor.

3. The voltage sequence output circuit of claim 1, wherein the second and the third electrical switches are p-channel field effect transistors, the first to the third terminals of the second and the third electrical switches corresponding to gates, sources, and drains of the p-channel field effect transistors.

4. The voltage sequence output circuit of claim 1, wherein the first control circuit further comprises a third resistor, the third resistor is connected between the output terminal of the NOR gate and the first terminal of the first electrical switch.

5. The voltage sequence output circuit of claim 1, wherein the voltage output circuit further comprises a first diode, an anode of the first diode is connected to the third terminal of the second electrical switch, and a cathode of the first diode is connected to the second terminal of the third electrical switch.

6. The voltage sequence output circuit of claim 5, further comprising a second control circuit, wherein the second control circuit comprises a NOT gate, a fourth electrical switch, and second and third diodes, wherein an input terminal of the NOT gate is connected to the output terminal of the NOR gate, an output terminal of the NOT gate is connected to a first terminal of the fourth electrical switch, a second terminal of the fourth electrical switch is connected to the power source, a third terminal of the fourth electrical switch is connected to anodes of the second and the third diodes, a cathode of the second diode is connected to the second terminal of the second electrical switch, and a cathode of the third diode is connected to the second terminal of the third electrical switch.

7. The voltage sequence output circuit of claim 6, wherein the fourth electrical switch is an npn transistor, the first to the third terminals of the fourth electrical switch corresponding to a base, a collector, and an emitter of the npn transistor.

8. The voltage sequence output circuit of claim 6, wherein the second control circuit further comprises a fourth resistor, the fourth resistor is connected between the output terminal of the NOT gate and the first terminal of the fourth electrical switch.

* * * * *